United States Patent
Hackner et al.

(10) Patent No.: US 9,983,235 B2
(45) Date of Patent: May 29, 2018

(54) METHOD AND DEVICE FOR MEASURING CURRENTS OR MAGNETIC FIELDS USING HALL SENSORS AND THEIR OFFSET-CORRECTED MEASUREMENT VALUES

(71) Applicant: FRAUNHOFER-GESELLSCHAFT ZUR FOERDERUNG DER ANGEWANDTEN FORSCHUNG E.V., Munich (DE)

(72) Inventors: Michael Hackner, Ot Haag (DE); Hans-Peter Hohe, Heiligenstadt (DE); Markus Sand, Erlangen (DE)

(73) Assignee: FRAUNHOFER-GESELLSCHAFT ZUR FOERDERUNG DER ANGEWANDTEN FORSCHUNG EV., Munich (DE)

( * ) Notice: Subject to any disclaimer, the term of this patent is extended or adjusted under 35 U.S.C. 154(b) by 416 days.

(21) Appl. No.: 14/380,388

(22) PCT Filed: Feb. 26, 2013

(86) PCT No.: PCT/EP2013/000564
§ 371 (c)(1),
(2) Date: Aug. 22, 2014

(87) PCT Pub. No.: WO2013/127522
PCT Pub. Date: Sep. 6, 2013

(65) Prior Publication Data
US 2015/0042326 A1    Feb. 12, 2015

(30) Foreign Application Priority Data
Feb. 28, 2012  (DE) .......... 10 2012 003 978

(51) Int. Cl.
G01R 33/07    (2006.01)
G01R 15/20    (2006.01)
G01D 5/14     (2006.01)
G01R 33/00    (2006.01)

(52) U.S. Cl.
CPC .......... G01R 15/202 (2013.01); G01D 5/142 (2013.01); G01R 33/0017 (2013.01); G01R 33/07 (2013.01); G01R 33/075 (2013.01)

(58) Field of Classification Search
CPC .......... G01R 33/0017; G01R 33/07; G01R 33/0072; G01R 33/075; G01R 33/077; G01R 15/202; G01D 5/142; G01D 5/145
See application file for complete search history.

(56) References Cited

U.S. PATENT DOCUMENTS 7,358,880 B1 *  4/2008  Melanson .............. G01R 33/07
                                                    341/143
8,063,629 B2   11/2011  Hackner et al. ......... 324/207.25
(Continued)

FOREIGN PATENT DOCUMENTS

DE    10 2009 006 546    8/2010    ............ G01D 1/06

OTHER PUBLICATIONS

International Search Report dated Jun. 13, 2013 in corresponding application No. PCT/EP2013/000564.
(Continued)

*Primary Examiner* — David M. Schindler
(74) *Attorney, Agent, or Firm* — Renner Kenner Greive Bobak Taylor & Weber

(57) ABSTRACT

The present invention relates to a method and a device for measuring currents or magnetic fields using at least one Hall sensor, which is operated with spinning current technology. In addition to first sample values for calculating a spinning current measurement value (6), second sample values are formed from the digitally converted sensor signals (1) of the (Continued)

Hall sensor in the method. The second sample values are formed over shorter periods of time (9) and are corrected with an offset, which is calculated from the spinning current measurement value (6) and the first sample values. In addition to the precise spinning current measurement value (6), fast offset-corrected measurement values (10) of the magnetic field or current are obtained using the method and the associated device, without elaborate calibration or additional analog circuitry expenses.

11 Claims, 3 Drawing Sheets

(56) References Cited

U.S. PATENT DOCUMENTS

| | | | | |
|---|---|---|---|---|
| 2007/0114988 | A1* | 5/2007 | Rossmann | G01D 3/036 324/207.2 |
| 2009/0009164 | A1 | 1/2009 | Utsuno | 324/251 |
| 2009/0261821 | A1 | 10/2009 | Motz | 324/251 |
| 2009/0315549 | A1* | 12/2009 | Hackner | G01R 33/07 324/251 |
| 2010/0026287 | A1* | 2/2010 | Muthers | G01R 33/0029 324/246 |
| 2012/0182658 | A1* | 7/2012 | Motz | G01P 3/489 361/91.5 |
| 2012/0194179 | A1 | 8/2012 | Motz | 324/251 |

OTHER PUBLICATIONS

Written Opinion dated Jun. 13, 2014 in corresponding application No. PCT/EP2013/000564.

Kerlain et al; *Hybrid Hall microsystem for high dynamic range/ large bandwidth magnetometry applications;* 2008 IEEE Sensors, Lecce, Italy; IEEE, Piscataway, NJ, USA; Oct. 26, 2008; pp. 1044-1047.

\* cited by examiner

METHOD AND DEVICE FOR MEASURING CURRENTS OR MAGNETIC FIELDS USING HALL SENSORS AND THEIR OFFSET-CORRECTED MEASUREMENT VALUES

CROSS-REFERENCE TO RELATED APPLICATION

This is a § 371 application of International patent application number PCT/EP2013/000564 filed Feb. 26, 2013, which claims the benefit of German patent application number 10 2012 003 978.6 filed on Feb. 28, 2013, and which is incorporated herein by reference.

TECHNICAL FIELD OF APPLICATION

The present invention relates to a method and a device for measuring currents or magnetic fields having at least one Hall sensor, which is operated with spinning current technology, and in which sensor signals from the Hall sensor are converted into digital signals with an analogue-to-digital converter, the digital signals are read from the analogue-to-digital converter and for each spinning current phase are combined over a first period in order to obtain a first sample, and the first samples of the spinning current phases of a spinning current cycle are summed to form a spinning current measurement value of the current or magnetic field.

PRIOR ART

Current measurement in electric drives has long been dominated by shunt resistors. These are usually easy to use, small in size and allow rapid signal analysis. However, shunt resistors cannot be used if, for example, a galvanically isolated measurement is to be made, if the current-carrying conductor either must not or cannot be disconnected, or if large enough currents can occur in the system such that a shunt would be destroyed or damaged. In these cases, magnetic measuring methods based on Hall sensors are recommended for measuring current. Commonly used Hall sensor systems are current converter modules with a magnetisable core for enhancing the magnetic flux. In a feedback loop system a fairly high measurement accuracy and measurement bandwidth is therefore obtained. With this solution however, volumes and costs are relatively high, because depending on the dimensioning a large amount of magnetically active material is needed.

In order to reduce the volumes and costs, it would be desirable to use magnetic field sensors without a magnetic core. The main problem in measuring current with Hall sensors without a magnetic core, however, is the relatively high sensor offset in relation to the signal magnitude. In almost every Hall sensor system the so-called spinning current principle is implemented to suppress the offset. For each measurement the direction of the operating current in the Hall element or Hall sensor, together with the signal output connections (Hall contacts), are switched over one or more times. From the individual measurements in the different spinning current phases (usually two or four) a cumulative value is formed, the offset component of which is markedly lower than in the individual phases. However, the use of the spinning current principle limits the measuring frequency that can be achieved, due to the transient oscillation processes occurring during switching between the individual phases and due to the accuracy of the readings required.

In modern electric drives high-precision dynamic converters, operated in clocked mode, are used to control the electric motors. For precision regulation of the converter voltages and currents, highly accurate, low-noise measurements of these parameters are required. To this end, Hall sensor systems for current measurement with $\Delta\Sigma$ modulators ($\Delta\Sigma M$) for analogue-to-digital conversion are ideally suited, if they are operated synchronously with the converter. In this case, full periods of the converter timer can be integrated over, resulting in a very accurate reading. The clock frequency is usually in the range of a few kHz to approximately 20 kHz, which is well within a possible range for the spinning current method. A. Kerlain et al., "Hybrid Hall microsystem for high dynamic range/large bandwidth magnetometry applications", IEEE SENSORS 2008 Conference, pages 1044 to 1047, show an example of such a Hall sensor system.

However, in practice it is still necessary to detect short-circuit currents in a very short space of time, so that the semiconductor switches are not thermally overloaded by the short circuit and thereby damaged or destroyed. To achieve this, measurement cycles with a maximum duration of 10 µs are required. For currently known Hall sensor systems working according to the spinning current principle, these short measurement times are not practical if precise measurements are to be provided for regulation at the same time. The proportion of the settling time after the switchover of the spinning current phases in relation to the actual signal detection time then becomes so large that the signal quality is significantly reduced due to noise.

To obtain a simultaneous, fast measurement therefore, a parallel duplicate system is currently required, but this significantly increases the effort and costs of measuring the current.

The object of the present invention is to specify a method and a device for measuring currents or magnetic fields with at least one Hall sensor, that enable an accurate and fast measurement of the current or magnetic field with little effort.

DESCRIPTION OF THE INVENTION

This object is achieved with the method and the device in accordance with claims 1 and 7. Advantageous configurations of the method and the device form the subject matter of the dependent claims or can be inferred from the following description together with the exemplary embodiments.

In the proposed method the Hall effect sensor is operated with spinning current technology, for example with two or four phases. In principle, it is possible to operate the Hall sensor with N phases, where N≥2. In the method, sensor signals from the Hall sensor are converted into digital signals with an analogue-to-digital converter, the digital signals are read from the analogue-to-digital converter and combined over a first period for each spinning current phase to obtain a first sample. The first samples of the spinning current phases of a spinning current cycle are added together to form a spinning current measurement value of the current or magnetic field. The sensor signals or output signals from the Hall effect sensor can be fed to the analogue-to-digital converter with or without prior amplification. The method is characterized by the fact that the digital signals from the analogue-to-digital converter are combined multiple times for each spinning current phase over a second time period, which is smaller than the first period, in order to obtain a plurality of second samples in chronological sequence, and from the spinning current measurement value for each spinning current phase an offset of the first samples is calculated and the second samples are corrected on the basis of this offset, in order to obtain fast offset-corrected measurement values of the current or magnetic field.

In the proposed method therefore, the accurate and rapid current or magnetic field measurement is integrated into a spinning current process. This means that, firstly, the thermal drift of the offset of the Hall elements above the temperature is systematically eliminated without the need for complicated calibration, and secondly, an excess current situation can also be detected quickly enough with sufficient accuracy. The circuit complexity thus does not increase substantially in comparison to a conventional measurement which uses the spinning current principle. In particular, no change in the analogue signal path is necessary, which is crucial for the measurement accuracy.

In contrast to the existing method of measuring magnetic fields or currents with Hall sensors using spinning current technology, with the method proposed here the single-phase measurement values (first samples) are not discarded after their addition to form the spinning current measurement value, but are stored in order to calculate the offset of these first samples from the spinning current measurement. The second samples are then corrected based on this offset to obtain offset-corrected second samples which correspond to the fast measurement values of the current or magnetic field. This means a suitable scaling of the offset is still generally necessary, because the first and second samples are combined over different time periods. The scale factor used corresponds to the ratio of the second period to the first period. This scaled offset can then be subtracted directly from the second samples—for each corresponding spinning current phase respectively.

With the proposed method and the device also described hereafter, the accuracy of the spinning current measurement values remains unchanged compared to previous methods which work purely according to the spinning current principle, and is not affected. At the same time, the method and the device also provide fast measurement values of the current or magnetic field, which have been subjected to an offset correction. This offset correction of the fast measurement values is systematically updated over the temperature range or other operating conditions. The very precise and very fast measurement values are simultaneously obtained with the same sensor and analogue front ends. There are no additional analogue components required. Elaborate calibrations of the sensor are also unnecessary.

In a preferred configuration of the method, after each switching of the spinning current phase, in a known manner, a wait time (first wait time) is inserted between the switching of the spinning current phase and the start of the period in which the first samples are formed, in order to avoid influences of the settling processes caused during switching on the accuracy of the spinning current measurement. In the same manner a wait period is also inserted between the switching of the spinning current phase and the first beginning of the second period of the respective phase for forming the second sample values. This second wait time can be chosen to be equal to the first wait time. However, it is preferably smaller than the first wait time, so that the second samples, which do not need to have the high level of accuracy of the first samples, are available more quickly following the switching of the spinning current phase. The second wait time preferably also corresponds to the time between each of two consecutive second periods, with the (second) wait times and second periods of each spinning current phase being preferably selected such that their sum exactly matches the length of the spinning current phase. This means that the clocking for the formation of the second samples is synchronized with the clocking of the spinning current operation of the Hall sensor.

Preferably, the sensor signals from the Hall sensor are converted into digital signals with a first-order $\Delta\Sigma$-converter, the analogue integrator of which is cleared before each new measurement of a spinning current phase. The combination of the digital signals over the first period is preferably effected by a first decimator, the combination of the digital signals over the second period by a second decimator. The combination in the present invention generally comprises a summation, possibly together with other operations, such as for the formation of an average.

In addition to the Hall sensor operated in spinning current technology, the device implemented for carrying out the method accordingly comprises an analogue-to-digital converter, a first combiner, which reads the digital signals from the analogue-to-digital converter and combines them over a first period for each spinning current phase in order to obtain a first sample, and an adder, which adds up the first sample values of the spinning current phases of a spinning current cycle to form a spinning current measurement value of the current or magnetic field. A second combiner combines the digital signals of the analogue-to-digital converter for each spinning current phase multiple times over a second period, which is smaller than the first period, in order to obtain a plurality of second samples in chronological sequence. From the spinning current measurement value a correction unit calculates, for each spinning current phase, an offset of the first samples and then corrects the second samples on the basis of this offset, to obtain offset-corrected fast measurement values of the current or magnetic field.

The proposed method and the associated device can be applied particularly advantageously for fast current measurement, for example, in electric drives, as was mentioned briefly in the introduction to the Description. The method and the device, however, can of course also be used more generally for fast magnetic field measurement, for example, in contactless position measurement with Hall effect sensors.

BRIEF DESCRIPTION OF THE DRAWINGS

The proposed method and the associated device are explained in more detail again below, based on exemplary embodiments in combination with the drawings. These show.

WAYS OF EMBODYING THE INVENTION

Figure 1:
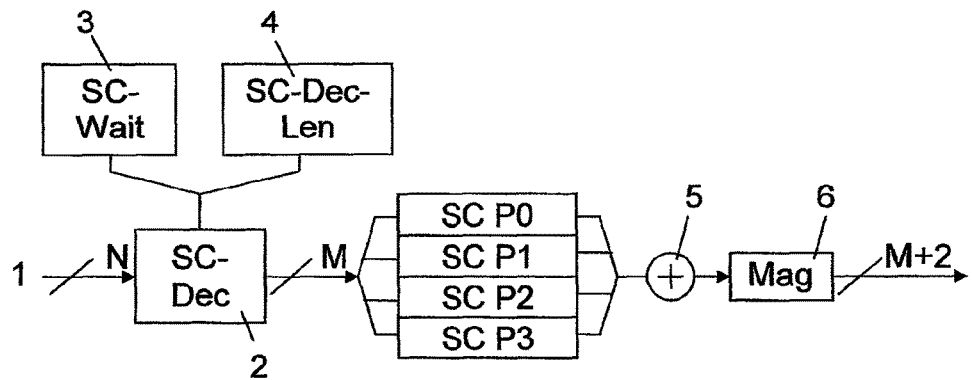
FIG. 1 an example of the evaluation of a conventional magnetic field measurement, using a Hall sensor which is operated in spinning current technology.

FIG. 1 shows an example of an evaluation of a magnetic field measurement with a Hall sensor, which is operated in the known manner in spinning current technology with four phases. The wiring of the Hall effect sensor for switching between the individual phases, together with any other analogue components used, such as a commonly used pre-amplifier for amplifying the output signals of the Hall effect sensor and the required analogue-to-digital converter, in the present example a ΔΣ modulator, are not shown in this or the following drawings. These components are, however, sufficiently well known from the prior art in current or magnetic field measurement with Hall sensors, for example from the publication by A. Kerlain et al. cited in the introduction.

The output signal of the Hall element in this arrangement is fed, with or without a pre-amplifier, to a first-order ΔΣ modulator which digitizes the signal. The analogue integrator of the ΔΣ modulator is cleared before each new measurement of a spinning current phase. The digital signal sequence 1 of the ΔΣ modulator is fed to a decimation filter 2 (simple digital accumulator). In the method of the prior art, the decimation filter 2 (SC-Dec) is cleared at the beginning of each spinning current (SC) cycle after the previous measurement result has been accepted by the system.

After the switching of the SC-phase a short period of time 3 is allowed to elapse, which the pre-amplifier needs to settle (SC-Wait: number of clock pulses which are not summed). The ΔΣ modulator is then enabled again and over a period 4 for a defined number of system clock pulses (SC-Dec-Len: decimation length, also designated as Tap) its output signal sequence is summed in the decimator 2, to form the single-phase measurement value.

In each case four single-phase measurement values SCP0-SCP3 are then summed in an adder 5 to form the SC cumulative value, in the present patent application also designated as the spinning current measurement value, which represents the actual measurement result proportional to the magnetic-field. In precise measuring systems the single-phase measurement values SCP0-SCP3 are then no longer needed, and are discarded after recalculation to form the final value. The calculated spinning current measurement value 6 (Mag: magnetic field) is output as the end result.

Figure 2:
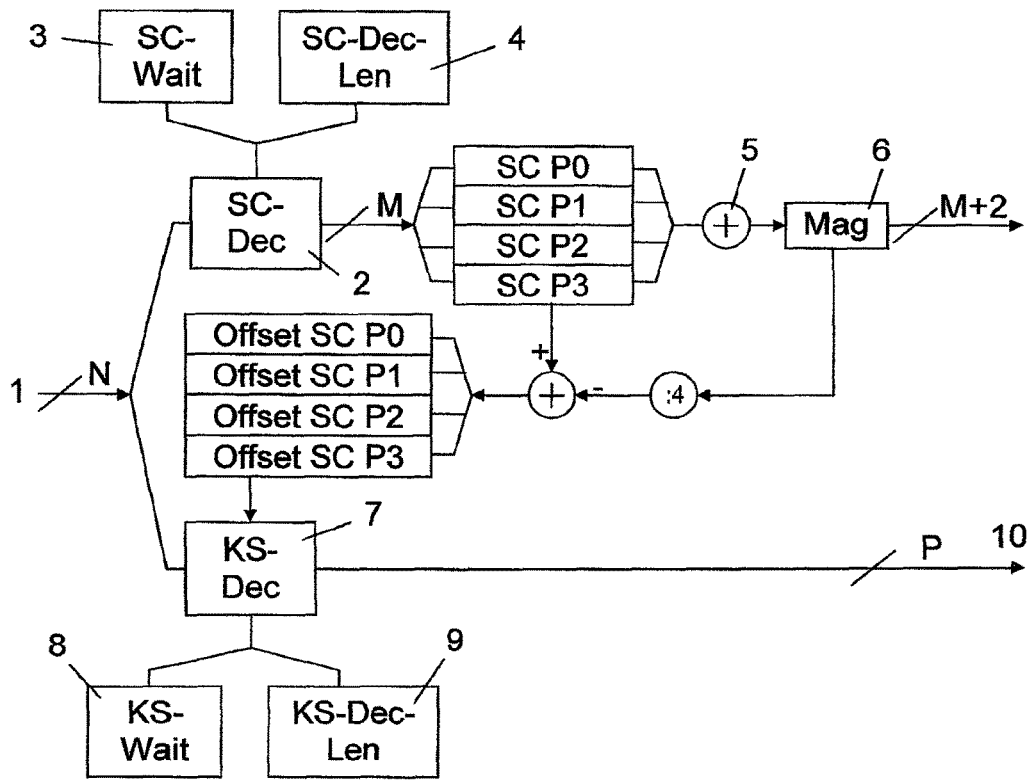
FIG. 2 an example of an evaluation in accordance with the proposed method.

In contrast, in the case of this present method the single-phase measurement values SCP0-SCP3 (in the case of a four-phase spinning current operation) are stored however. FIG. 2 shows a schematic representation of the procedure in one configuration of the proposed method. The upper part of the figure corresponds to the calculation of the SC measurement value 6 shown in FIG. 1. In addition, in the method proposed here, from the SC measurement value 6 and the single-phase measurement values SCP0-SCP3, in the present patent application also designated as first samples, an offset is calculated in each case for these first samples, as schematically indicated in the figure. This is carried out in the following manner:

From the stored single-phase measurement values $SC_{P0}$=Magnetic Field+Offset$_{SCPhase0}$ $SC_{P1}$=Magnetic Field+Offset$_{SCPhase1}$ $SC_{P2}$=Magnetic Field+Offset$_{SCPhase2}$ $SC_{P3}$=Magnetic Field+Offset$_{SCPhase3}$ the 4-phase measurement value, or spinning current measurement value (magnetic field) is calculated:

$SC_{P0}$+$SC_{P1}$+$SC_{P2}$+$SC_{P3}$=4·Magnetic field+ Offset$_{SCPhase0}$+Offset$_{SCPhase1}$+Offset$_{SCPhase2}$+ Offset$_{SCPhase3}$ Due to the properties of the sensors, the following applies:

Offset$_{SCPhase0}$+Offset$_{SCPhase1}$+Offset$_{SCPhase2}$+Offset$_{SCPhase3}$=0 and therefore:

$SC_{P0}$+$SC_{P1}$+$SC_{P2}$+$SC_{P3}$=4·Magnetic field.

By appropriate rearrangement of the first set of equations $SC_{P0}$=Magnetic field+Offset$_{SCPhase0}$=>Offset$_{SCPhase0}$=Magnetic field−$SC_{P0}$ $SC_{P1}$=Magnetic field+Offset$_{SCPhase1}$=>Offset$_{SCPhase1}$=Magnetic field−$SC_{P1}$ $SC_{P2}$=Magnetic field+Offset$_{SCPhase2}$=>Offset$_{SCPhase2}$=Magnetic field−$SC_{P2}$ $SC_{P3}$=Magnetic field+Offset$_{SCPhase3}$=>Offset$_{SCPhase3}$=Magnetic field−$SC_{P3}$ one obtains the rules with which the respective single-phase offsets (Offset$_{SCPhaseX}$) can be determined from the single-phase measurement values.

These single-phase offsets can then be deducted from the sample value of the fast measurement, depending on the spinning current phase currently set. This can be carried out either after the measurement by explicit subtraction, or before the start of the decimation by means of an appropriate presetting of the decimation filter.

The fast measurement values are obtained in this case from the digital signal sequence 1 of the ΔΣ modulator, which is fed to a second decimator 7 (KS-Dec). In this second decimator 7, the second samples are calculated in the same manner as were the first samples in the first decimator 2. The wait time 8 (KS-Wait: number of clock pulses that are not summed) after switching of the SC phase is preferably chosen to be shorter than the first wait time 3 (SC-Wait) for forming the first samples. The second period 9 (KS-Dec-Len: decimation length), over which the digital signals of the ΔΣ modulator are then summed to form the second samples, is chosen to be shorter than the first period 4 (SC-Dec-Len) for forming the first samples. The second samples are corrected according to the offsets calculated from the SC measurement value 6, so that fast measurement values 10 of the current or magnetic field can be output as a result.

An additional correction of the values is normally necessary, since the decimation lengths (first and second periods) for the exact and the fast measurement differ by their very nature. This has an impact on the scaling of the measurement values. The ratio of these scales must also be corrected. In favourable cases this can be achieved by simple shift operations in the digital part of the measurement device. In general however, the value must be multiplied by a fractional number:

$$\text{Offset Scaling factor} = \frac{KSDecLen}{SCDecLen}$$

Figure 3:
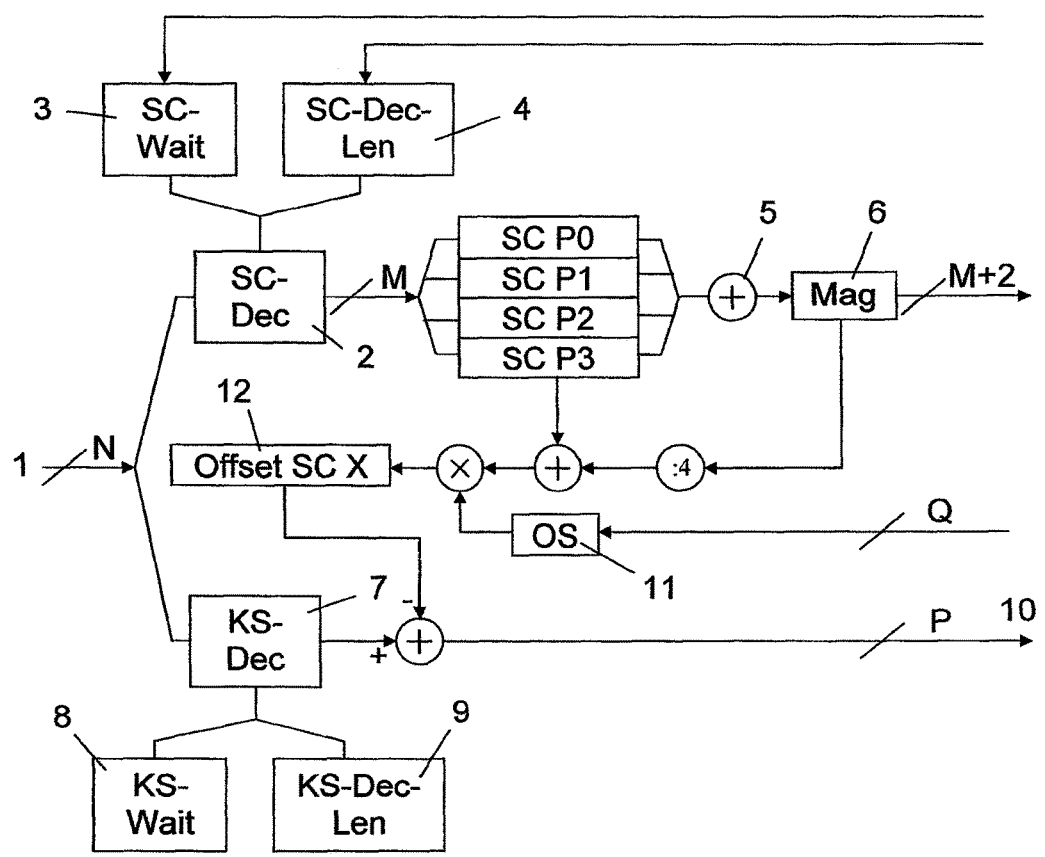
FIG. 3 a second example of an evaluation in accordance with the proposed method.

Since this value does not change during operation, it can be passed to the system as a constant in the same way as KS-Dec-Len and SC-Dec-Len. On this point, FIG. 3 shows the offset correction of the fast measurement value with this scaling of the measured offset values according to the ratio of the decimation lengths. This is achieved here by setting the offset-scaling factor 11 (OS), with which the offset values calculated from the SC-measurement value 6 and the single-phase measurement values SCP0-SCP3 are multiplied. The appropriately corrected offset 12 is then subtracted from the second samples accordingly.

A second additional correction is necessary if additional magnetic fields are induced into the system. This may be the case, for example, if the sensitivity of the measurement system is to be measured with a constant current by means of an integrated magnetic field coil. With appropriate usage, this can even be carried out simultaneously with the measurement of the magnetic fields or currents, without loss of measurement values.

However, in this case, the increase of the magnetic field due to the additional induced magnetic fields is known to the system and can be retrospectively deducted from the fast measurement values. In order that the achievable accuracies in both digital measurement paths (fast and accurate measurement) can be exploited in an optimal manner, the waiting periods (waiting times) and decimation lengths (first and second period) for both measurements must be selected such that the following applies:

SC-Wait+SC-Dec-Len=(KS-Wait+KS-Dec-Len)*Factor, where Factor=2, 3, . . . N.

When using an offset centring process, such as is known from DE 10 2006 059 421 B4, it may be necessary for the control point for the offset correction value used in this document, which is always applied to two SC-phases together, to be corrected in running operation. This means that the respective single-phase measurement values will also change even with a constant magnetic field. However, since the size of the change is known in the system, this change can also be corrected in the fast measurement values during running operation.

Figure 4:
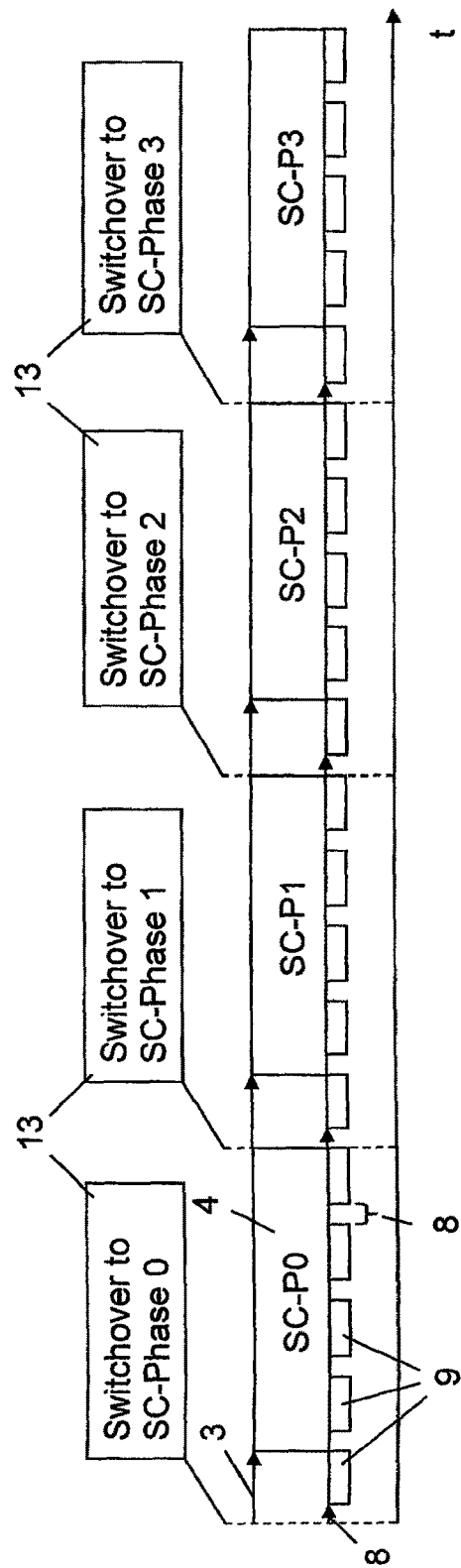
FIG. 4 an example of the synchronization of fast and accurate measurement in accordance with the proposed method.

Under the proposed method, both measurement cycles should also run synchronously, such that the waiting period of the fast measurement (second waiting time) begins at the same time as a waiting period of the slow measurement (first waiting time), since this is when switching occurs between the spinning current phases. This is indicated schematically in FIG. 4 for a four-phase operation. The figure indicates the switching processes 13, the first and second waiting time 3, 8 and the first and second period 4, 9 for the fast and the accurate measurement. The waiting times of the fast measurement are much shorter than those of the accurate measurement. However, this is permissible, because only a lower accuracy is expected for the fast measurement values.

LIST OF REFERENCE NUMERALS

1 Digital signal sequence of the ΔΣ modulator
2 First decimator (SC-Dec)
3 First wait time (SC-Wait)
4 First period (SC-Dec-Len)
5 Adder
6 SC measurement value
7 Second decimator (KS-Dec)
8 Second wait time (KS-Wait)
9 Second period (KS-Dec-Len)
10 Fast measurement value
11 Offset scaling factor (OS)
12 Corrected offset
13 Switching between phases

The invention claimed is:

1. A method for measuring a current or a magnetic field with at least one Hall sensor which is operated with N≥2 spinning current phases per a spinning current cycle, comprising:

converting sensor signals generated by the Hall sensor with an analogue-to-digital converter into digital signals, reading and combining the digital signals of the analogue-to-digital converter over a first time period within each spinning current phase to obtain a first sample for each of the spinning current phases, each first sample obtained from switching between the spinning current phases of the at least one Hall sensor summing the first samples of the spinning current phases of the spinning current cycle to form a spinning current measurement value of the current or the magnetic field, combining the digital signals of the analogue-to-digital converter a plurality of times over a respective second time period within each spinning current phase, wherein the second time period is smaller than the first time period, in order to obtain a plurality of second samples in chronological sequence for each of the spinning current phases, each plurality of second samples obtained from the switching between the spinning current phases of the at least one Hall sensor, calculating an offset for each spinning current phase of the first samples from the spinning current measurement value, and correcting the second samples based on the offset, in order to obtain offset-corrected fast measurement values of the current or the magnetic field.

2. The method according to claim 1, further comprising inserting after each switching between the spinning current phases a first wait time between the switching and a beginning of the first time period.

3. The method according to claim 2, further comprising inserting after each switching between the spinning current phases a second wait time between the switching and a beginning of the second time period, which is equal to the first wait time or shorter than the first wait time.

4. The method according to claim 1,
wherein the analogue-to-digital converter is a delta-sigma converter of the first order.

5. The method according to claim 1,
further comprising
amplifying the sensor signals from the Hall sensor prior to the analogue-to-digital conversion.

6. The method according to claim 1,
further comprising
combining the digital signals over the first time period by means of a first decimator, and combining the digital signals over the second time period by a second decimator.

7. A device for measuring a current or a magnetic field with at least one Hall sensor that is operated in spinning current with N≥2 spinning current phases per a spinning current cycle, wherein the device comprises switches for switching between the spinning current phases, an analogue-to-digital converter, with which sensor signals from the Hall sensor are converted into digital signals, a first combiner, which reads out the digital signals from the analogue-to-digital converter and combines them over a first time period within each spinning current phase in order to obtain a first sample for each of the spinning current phases, and an adder, which sums the first samples of the spinning current phases of the spinning current cycle to form a spinning current measurement value of the current or the magnetic field, characterized by
a second combiner, which combines the digital signals from the analogue-to-digital converter a plurality of times over a respective second time period within each spinning current phase, which is smaller than the first time period, in order to obtain a plurality of second samples in chronological sequence, and
a correction unit, which calculates from the spinning current measurement value, for each spinning current phase, an offset of the first samples and corrects the second samples on the basis of this offset, in order to obtain offset-corrected fast measurement values of the the current or the magnetic field.

8. The device according to claim 7,
characterized in that
the analogue-to-digital converter is a delta-sigma converter of the first order.

9. The device according to claim 7,
characterized in that
each of the first combiner and the second combiner is a decimator.

10. The method according to claim 3,
comprising the combining of the digital signals over the first time period is by means of a first decimator, and the combining of the digital signals over the second time period is by means of a second decimator.

11. The device according to claim 8,
characterized in that
each of the first combiner and the second combiner is a decimator.

* * * * *